United States Patent
Nagashima et al.

(10) Patent No.: US 8,423,705 B2
(45) Date of Patent: Apr. 16, 2013

(54) SEMICONDUCTOR DEVICE AND METHOD FOR CONTROLLING THEREOF

(75) Inventors: Hirokazu Nagashima, Kawasaki (JP); Kazuki Yamauchi, Kawasaki (JP); Junya Kawamata, Kawasaki (JP); Tsutomu Nakai, Kawasaki (JP); Kenji Arai, Kawasaki (JP); Kenichi Takehana, Kawasaki (JP)

(73) Assignee: Spansion LLC, Sunnyvale, CA (US)

( * ) Notice: Subject to any disclaimer, the term of this patent is extended or adjusted under 35 U.S.C. 154(b) by 835 days.

(21) Appl. No.: 12/139,274

(22) Filed: Jun. 13, 2008

(65) Prior Publication Data

US 2008/0320208 A1  Dec. 25, 2008

(30) Foreign Application Priority Data

Jun. 15, 2007  (JP) .................................. 2007-159566

(51) Int. Cl.
 *G06F 12/02* (2006.01)
(52) U.S. Cl.
 USPC ........... 711/103; 711/170; 711/173; 711/156; 711/E12.008
(58) Field of Classification Search ........................ None
See application file for complete search history.

(56) References Cited

U.S. PATENT DOCUMENTS

| 5,153,684 | A | * | 10/1992 | Shoji et al. | 257/315 |
| 5,369,616 | A | * | 11/1994 | Wells et al. | 714/723 |
| 5,402,383 | A | * | 3/1995 | Akaogi | 365/218 |
| 6,253,202 | B1 | * | 6/2001 | Gilmour | 707/999.01 |
| 7,594,135 | B2 | * | 9/2009 | Gonzalez et al. | 714/6.1 |
| 2002/0026566 | A1 | * | 2/2002 | Awada et al. | 711/162 |
| 2003/0067818 | A1 | * | 4/2003 | Hirano | 365/200 |
| 2008/0256363 | A1 | * | 10/2008 | Balacheff et al. | 713/187 |

FOREIGN PATENT DOCUMENTS

| JP | 06-119230 | 4/1994 |
| JP | 2001-243781 | 9/2001 |
| JP | 2004-227736 | 12/2004 |

* cited by examiner

*Primary Examiner* — Michael Krofcheck

(57) ABSTRACT

A semiconductor device includes a first nonvolatile storage area including a plurality of sectors, a second nonvolatile storage area, a third nonvolatile storage area located in the first nonvolatile storage area, a fourth nonvolatile storage area located in the second nonvolatile storage area, and a control portion selecting one of a first mode and a second mode. In first mode, sectors where the third nonvolatile storage area is not located in the first nonvolatile storage area are used as a main storage area, and the second nonvolatile storage area is used to store a program or data that is read before the first nonvolatile storage area is accessed, the third nonvolatile storage area being used to store control information that controls writing, reading, and erasing of data involved in the first nonvolatile storage area or the second nonvolatile storage area. In the second mode, the first nonvolatile storage area is used as the main storage area, and the fourth nonvolatile storage area is used to store the control information.

8 Claims, 6 Drawing Sheets

FIG. 2A
FIG. 2B
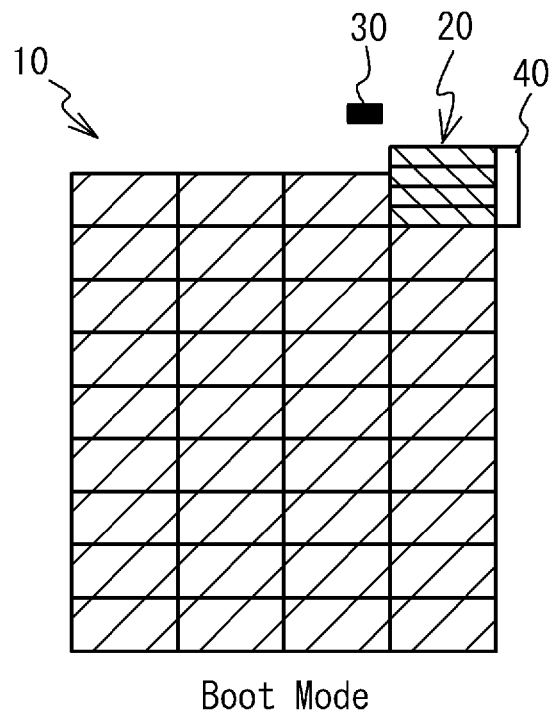
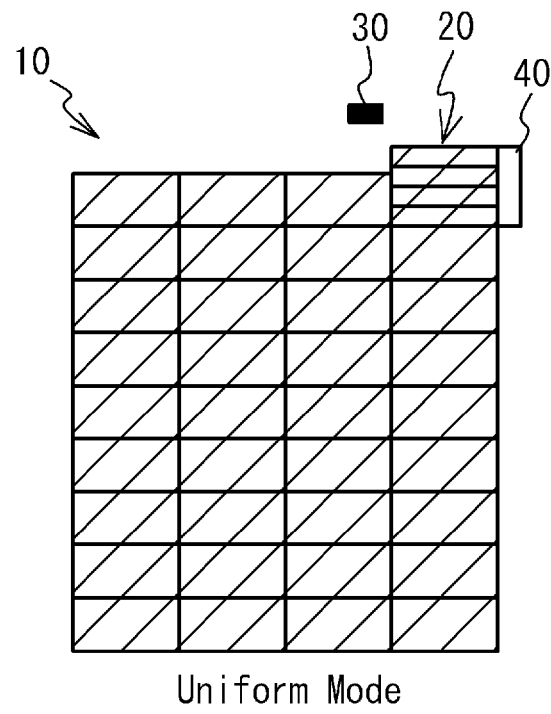
Boot Mode
Uniform Mode

BootMode

Uniform Mode

Boot Mode

Uniform Mode

SEMICONDUCTOR DEVICE AND METHOD FOR CONTROLLING THEREOF

CROSS-REFERENCE TO RELATED APPLICATIONS

The present invention is based on Japanese Patent Application No. 2007-159566 filed on Jun. 15, 2007, the disclosure of which is hereby incorporated by reference.

TECHNICAL FIELD

The present invention relates to a semiconductor device and a method for controlling thereof, and in particular, to a semiconductor device having two different operation modes, and a method for controlling thereof.

BACKGROUND OF THE INVENTION

Recently, various types of nonvolatile memories such as electrically programmable and erasable ROMs (flash memories) have been developed. The NOR type flash memory, which is a typical nonvolatile memory, is excellent in random access, as compared to the NAND type, and is mainly used to store a program for operating electronic devices. The NOR flash memory may be grouped into a boot type memory and a uniform type memory. The boot type memory has a small storage area (hereafter, boot area) in addition to the main storage area. The boot area stores data or a program that is read before the main storage area is accessed. The uniform type memory is not equipped with the boot area.

Japanese Patent Application Publication No. 2001-243781 (Document 1) discloses a semiconductor device that has a second storage area in addition to a first main storage area. By logically replacing a part of the first main storage area with a part of the second storage area in the same column, the address of the second storage area can be selected efficiently. Japanese Patent Application Publication No. 2000-268584 (Document 2) discloses a nonvolatile memory in which the nonvolatile memory should be shipped as a flash memory (capable of erasing and rewriting data) or a one time memory (not capable of erasing and erasing data) by the a manufacturer of an electronic device equipped with the memory. Japanese Patent Application Publication No. 2005-85398 (Document 3) discloses a nonvolatile memory having limited access to protection information under a certain condition. The protection information contains information that permits or inhibits writing, reading, and erasing data stored in the nonvolatile memory.

In recent years, semiconductor devices are required to have a reduced size and a higher integration density for the purpose of downsizing and manufacturing cost reduction of electronic devices.

SUMMARY OF THE INVENTION

The present invention has been made in view of the above circumstances and provides a semiconductor device having selectable operation modes and a reduced size of a storage area, and a controlling method thereof.

According to an aspect of the present invention, there is provided a semiconductor device including: a first nonvolatile storage area including a plurality of sectors; a second nonvolatile storage area; a third nonvolatile storage area located in the first nonvolatile storage area; a fourth nonvolatile storage area located in the second nonvolatile storage area; and a control portion selecting one of a first mode and a second mode, wherein: in the first mode, sectors where the third nonvolatile storage area is not located in the first nonvolatile storage area are used as a main storage area, and the second nonvolatile storage area is used to store a program or data that is read before the first nonvolatile storage area is accessed, the third nonvolatile storage area being used to store control information that controls writing, reading, and erasing of data involved in the first nonvolatile storage area or the second nonvolatile storage area; and in the second mode, the first nonvolatile storage area is used as the main storage area, and the fourth nonvolatile storage area is used to store the control information.

BRIEF DESCRIPTION OF THE DRAWINGS

FIG. 2A and FIG. 2B are schematic diagrams of a storage area of a semiconductor device according to a second comparative example;

DETAILED DESCRIPTION

First, an issue solved by the present invention is described in detail. As described before, the NOR flash memory is grouped into a boot type memory and a uniform type memory. Recently, there has been developed a memory device, which can be chosen as the boot type memory or the uniform type memory by a manufacturer of an electronic device. The manufacturer can choose the type of the memory suitably according to the specification of an electric device equipped with the flash memory, and so on. Therefore, the manufacturer can reduce the cost of manufacturing and development.

The semiconductor devices are required to have a reduced size and a higher integration density for the purpose of downsizing and manufacturing cost reduction of electronic devices. However, it is difficult to reduce the size of the storage area in recent memory device, which will be described as comparative examples below.

The present invention has been made taking the above issues into consideration and has an object of providing a semiconductor device having a reduced size of a storage area, and a controlling method thereof.

A description will now be given of embodiments of the present invention and comparative examples with reference to the accompanying drawings.

First Comparative Example

Figure 1A:
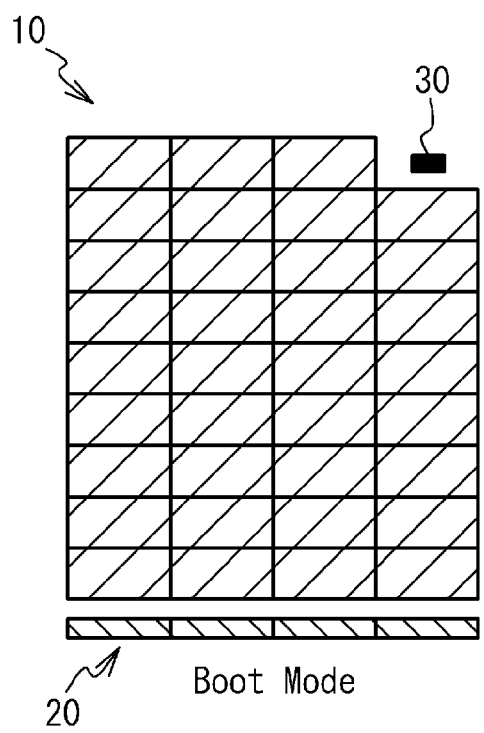
FIG. 1A and FIG. 1B are schematic diagrams of a storage area of a semiconductor device according to a first comparative example.
Figure 1B:
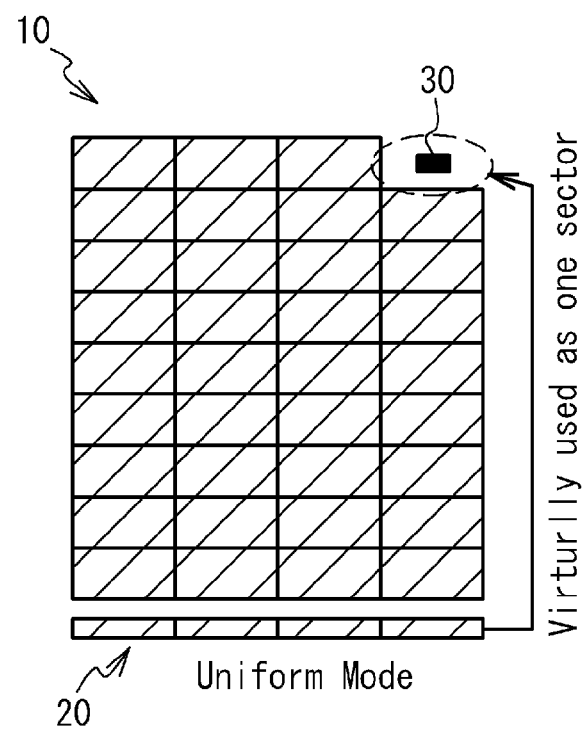

FIG. 1A and FIG. 1B are schematic diagrams of a storage area of a semiconductor device according to a first comparative example. Referring to FIG. 1A, there are illustrated a first storage area 10 and a second storage area 20 connected together. The first storage area 10 and the second storage area 20 are respectively nonvolatile memories, each including a plurality of sectors. There is an empty area equal to one sector in an upper right part in the first storage area 10, in which a third nonvolatile storage area 30 is located. The sector is a unit at the time of writing data. The first storage area 10 and the second storage area 20 have an identical number of columns, and share a well in the vertical direction. Data stored in the storage area are erased on the column basis. Although each of the first storage area 10 and the second storage area 20 is originally composed of eight columns, some of them are omitted here in FIG. 1A and FIG. 1B for the sake of simplicity.

A description is given of the role of each storage area in the first mode (hereafter, boot mode) with reference to FIG. 1A. The boot mode is a mode that prepares a boot area in addition to a main storage area. The boot area is used to store data or the program that is read before the main storage area is accessed. In the boot mode, the first storage area 10 is used as the main storage area and a variety of data (for instance, character data, image data, and so on) may be stored. The second storage area 20 is used as the boot area, and stores data or a program (for instance, a boot program, a security password, and so on) that is read during an initial setting period after power on or reset. The third storage area 30 is programmable only once, which is so-called one time programmable memory (hereafter, OTP), and is used to store information (for instance, protecting information, redundancy address, and so on) to control a writing, reading, or erasing operation.

A description is given of the role of each storage area in the second mode (hereafter, uniform mode) with reference to FIG. 1B. The uniform mode is a mode that does not prepare the boot area but uses the whole storage area as a main storage area. The first storage area 10 and the second storage area 20 are used as the main storage area. The second storage area 20 is divided into blocks, each of which is associated with the corresponding sector of the first storage area, and one block has a size equal to ⅛ of one sector. The second storage area 20 may be logically substituted for the empty area in one sector located in the upper right part in the first storage area 10. Thus, the first storage area 10 and the second storage area 20 may be used together as a virtual main storage area. The third storage area 30 may be used as OTP to store a variety of control information.

In the first comparative example, the second storage area 20 is logically substituted for the storage area equal to one sector of the first storage area 10. Therefore, the third storage area 30 may be located in the empty area in the upper right part in the first storage area 10, so that the size of the entire storage area can be reduced.

However, the semiconductor device of the first comparative example erases stored data on the column basis. Therefore, in the uniform mode, it is necessary to apply a high voltage (for instance, 12V) to the entire storage area of the second storage area 20 in order to erase data stored therein. It is thus necessary to configure a drive circuit capable of generating a larger current than that for erasing only one column. This makes it difficult to reduce the size of the semiconductor device.

Second Comparative Example

FIG. 2A and FIG. 2B are schematic diagrams of a storage area of a semiconductor device according to a second comparative example. A description is not given of parts of the second comparative example common to those of the first comparative example. The second storage area 20 is located in an empty area in the upper right part in the first storage area 10. The second storage area 20 has a plurality of blocks arranged in the column direction. A block selection circuit 40 is connected to the second storage area 20. Although each of the first storage area 10 and the second storage area 20 is originally composed of eight columns, some of them are omitted in FIG. 2A and FIG. 2B for the sake of simplicity.

Referring to FIG. 2A, each storage area is used in the boot mode as follows. The first storage area 10 is used as the main storage area, the second storage area 20 is used as the boot area, and the third storage area 30 is as OTP to store a variety of control information. Referring to FIG. 2B, each storage area is used in the uniform mode as follows. The first storage area 10 and the second storage area 20 are used as the main storage area, and the third storage area 30 is used as OTP. In the uniform mode, the second storage area 20 is logically substituted for an empty area equal to one sector in the upper right part in the first storage area. Since the plurality of blocks of the second storage area are arranged in the column direction, the erase voltage may be applied to only the right end column including the second storage area 20. Therefore, a high voltage is not needed for the entire storage area as in the case of the first comparative example, and the circuit that generates the large current is no longer needed.

The arrangement of the second storage area 20 located in the column direction requires the block selection circuit 40 to distinguish the blocks in the second storage area 20 from each other in the boot mode. Since the block selection circuit 40 needs a large space, the second storage area 20 has a greater area than the area equal to one sector of the first storage area 10. As a result, the second storage area 20 extends beyond the first storage area 10. In addition, since the second storage area 20 is located in the empty space in the first comparative example, the third storage area 30 cannot be located in the empty area. This causes a problem that the entire storage area has a big size.

Third Comparative Example

Figure 3A:
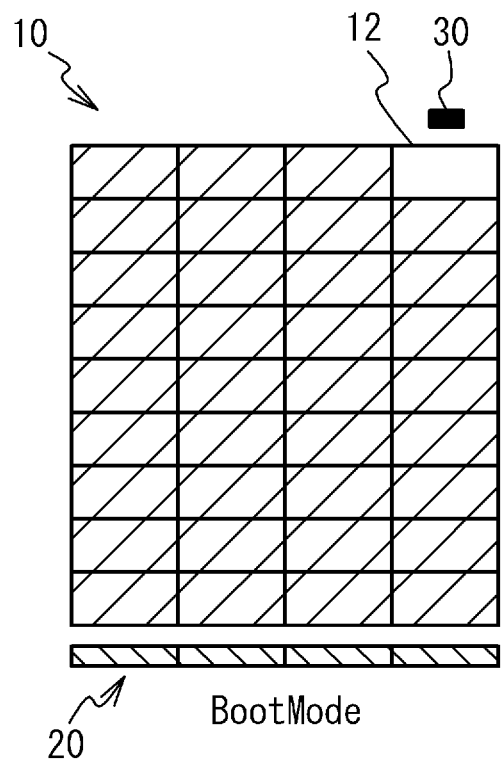
FIG. 3A and FIG. 3B are schematic diagrams of a storage area of a semiconductor device according to a third comparative example.
Figure 3B:
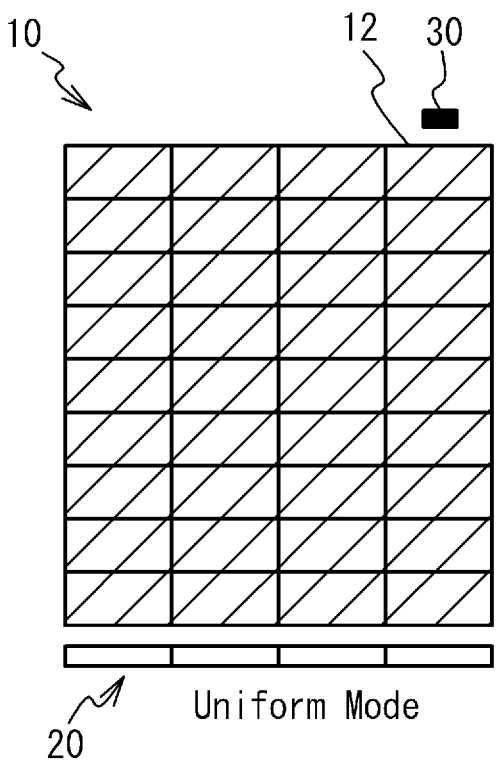

FIG. 3A and FIG. 3B are schematic diagrams of a storage area of a semiconductor device according to a third comparative example. A description is not given of parts of the third comparative example common to those of the first comparative example. Unlike the first comparative example, the empty space does not exist in the upper right part in the first storage area 10, but a sector 12 is located instead. This sector 12 has a size as large as the other sectors of the first storage area 10. Although each of the first storage area 10 and the second storage area 20 is originally composed of eight columns, some of them are omitted in FIG. 3A and FIG. 3B for the sake of simplicity.

Referring to FIG. 3A, each storage area is used in the boot mode as follows. In the first storage area 10, all sectors except the sector 12 are used as the main storage area. The second storage area 20 is used as the boot area, and the third storage area is used as OTP to store a variety of control information. The upper right sector (sector 12) is not used. Referring to FIG. 3B, each storage area is used in the uniform mode as follows. The whole first storage area 10 is used as a main storage area, and the third storage area 30 is used as OTP. The second storage area 20 is not used.

In the third comparative example, unlike the first and the second comparative examples, the second storage area 20 is not logically substituted for the first storage area. As a result, it is possible to erase and rewrite data on the column basis and omit a drive circuit capable of generating high voltage. However, the first storage area 10 does not have the empty space, and the third storage area 30 cannot be located therein. This causes a problem that the entire memory has a large size as in the case of the second comparative example.

EMBODIMENTS OF THE PRESENT INVENTION

Figure 4A:
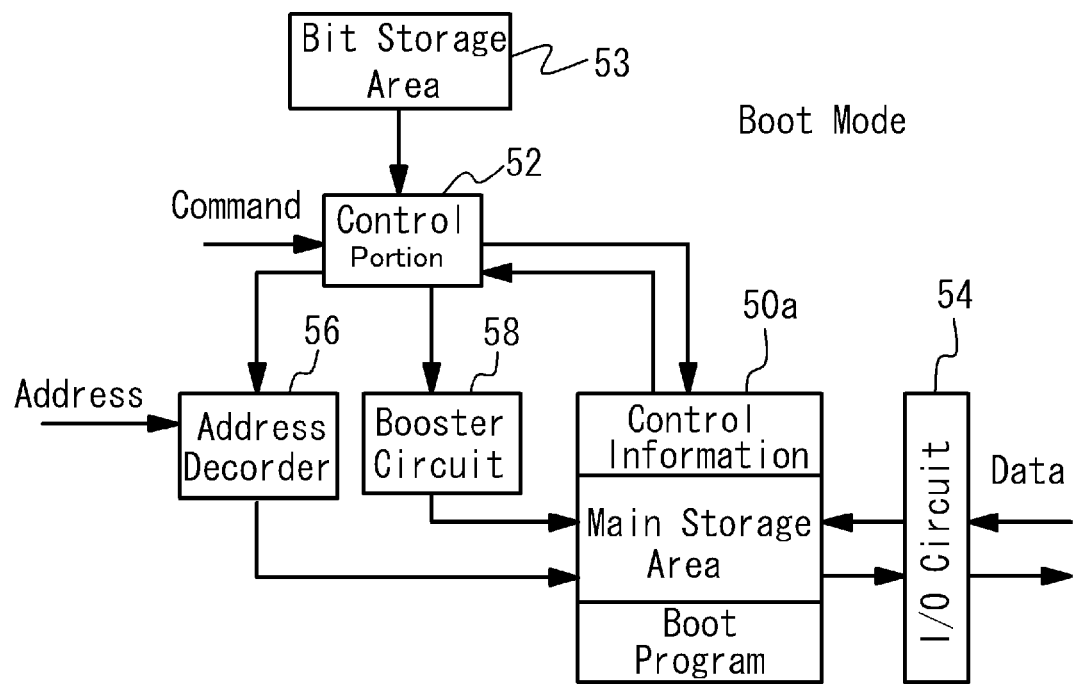
FIG. 4A and FIG. 4b are block diagrams of a semiconductor device according to an embodiment of the present invention.
Figure 4B:
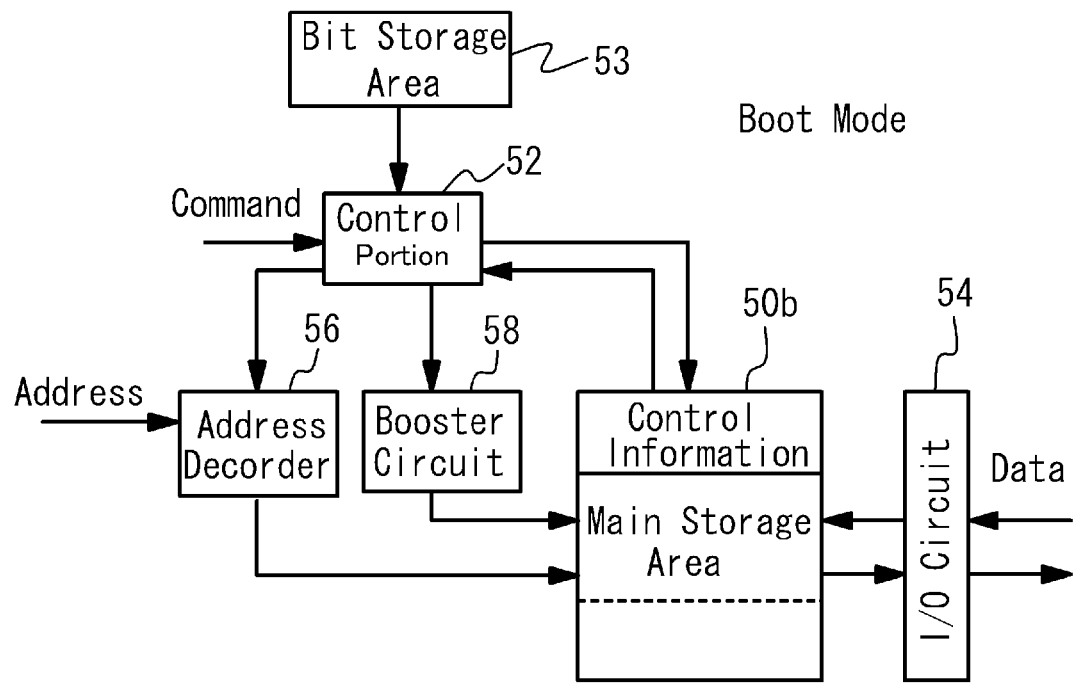

FIG. 4A and FIG. 4B are block diagrams of a semiconductor device according to an embodiment of the present invention. Referring to FIG. 4A, the semiconductor device is equipped with a storage area 50a, a control portion 52, a bit storage area 53, an I/O circuit 54, an address decoder 56, and a booster circuit 58. The storage area 50 stores various data. The control portion 52 controls writing, reading, and erasing operations. The control portion 52 also selects the operating mode (a first mode or a second mode) of the semiconductor device. The bit storage area 53 stores bit data for the mode selection. The I/O circuit 54 exchanges data with an external circuit. The address decoder 56 receives an address signal and accesses a given area in the storage area 50a. The booster circuit 58 generates a boosted voltage necessary for the writing, reading, and erasing data.

Figure 5A:
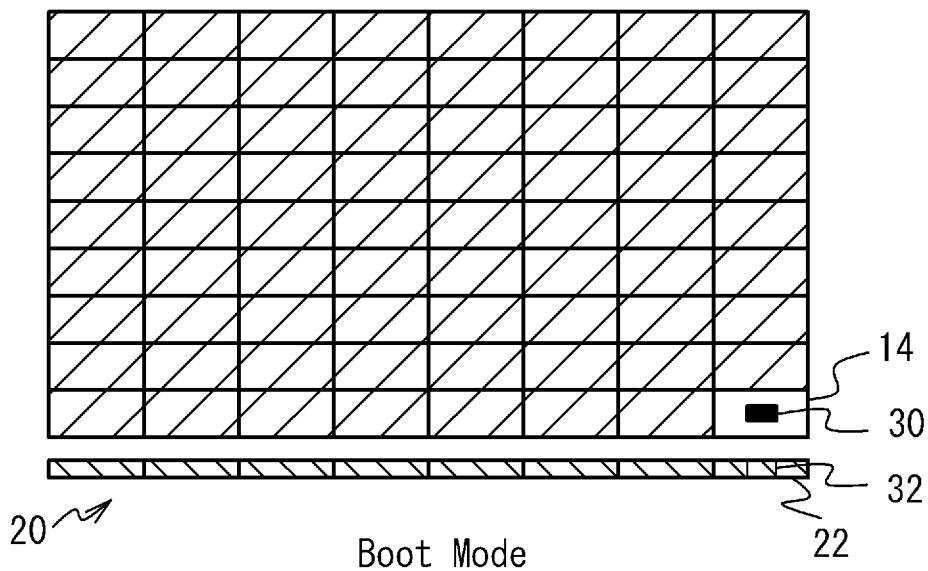
FIG. 5A and FIG. 5B are schematic diagrams of a storage area of a semiconductor device according to the embodiment of the present invention.
Figure 5B:
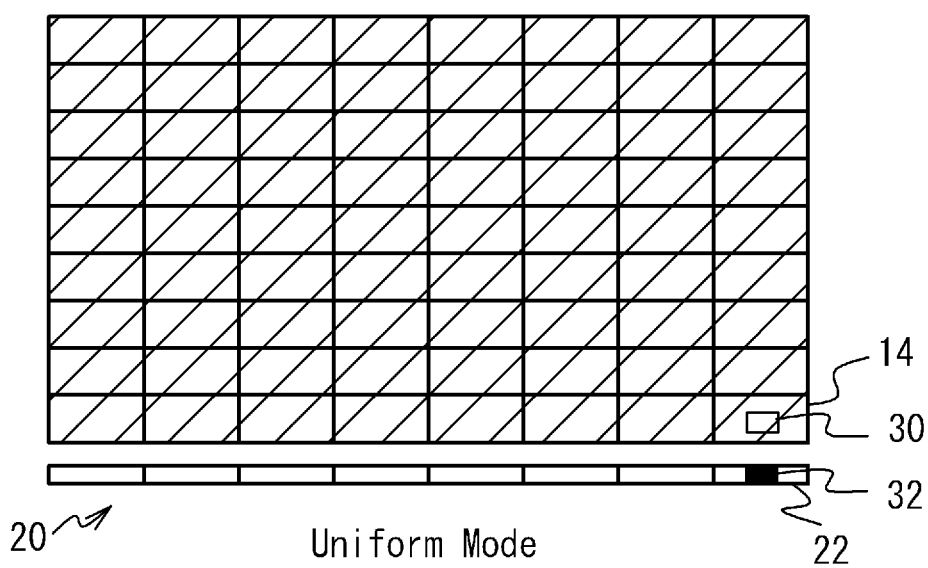

FIG. 5A and FIG. 5B are schematic diagrams of a storage area of the semiconductor device. Referring to FIG. 5A, the first storage area 10 includes a plurality of sectors and the second storage area 20 includes a plurality of blocks. The first storage area 10 and the second storage area 20 are nonvolatile memory areas. The first storage area 10 is larger than the second storage area 20, and the size of one sector of the first storage area 10 is equal to the size of the entire second storage area 20. The first storage area 10 and the second storage area 20 have an identical number of columns (eight columns), and data may be erased on the column basis by the control portion 52 (shown in FIG. 4A and FIG. 4B).

The second storage area 20 is divided into blocks, each of which is associated with the corresponding sector of the first storage area, and is equal to ⅛ of one sector in size. The third storage area 30 is located in a lower right sector 14 of the first storage area 10, and a fourth storage area 32 is located in the block 22 located at the right end of the second storage area 20. The third storage area 30 and the fourth storage area 32 are nonvolatile memory areas, and are used to store control information described later. The third storage area 30 and the fourth storage area 32 are one time memories that are programmable only once, and the same configuration and function. The third storage area 30 and the fourth storage area 32 are located in the same column. The sector 14 located in the third storage area 30 is adjacent to the block 22 in which the fourth storage area 32 is provided.

The first storage area 10, the second storage area 20, the third storage area 30, and the fourth storage area 32 are connected to the control portion 52. As will be described later, the control portion 52 selects the operating mode of the semiconductor device. The first mode is the boot mode, and the second mode is the uniform mode. Either the third storage area 30 or the fourth storage area 32 is selected as OTP to store a variety of control information.

The configuration of the semiconductor device in the boot mode will now be described with reference to FIG. 4A and FIG. 5A. Referring to FIG. 4A, the storage area 50a stores a variety of control information and main memory data. Further, the storage area 50a is used to store data or a program (for example, boot program) that is read during the initial setting period after power on or reset. Referring to FIG. 5A, sectors except one sector 14 where the third storage area 30 is located are used as the main storage area in the first storage area 10. The second storage area 20 is used as the boot area. At this time, a block 22 where the fourth storage area 32 is located is also used as the boot area. The third storage area 30 located in the first storage area 10 is used as OTP to store a variety of control information. The part of the sector 14 other than the third storage area 30 is unused.

The configuration of the semiconductor device in the uniform mode will now be described with reference to FIG. 4B and FIG. 5B. Referring to FIG. 4B, the storage area 50b stores a variety of control information and main memory data. Unlike FIG. 4A, the storage area 50b does not store the boot program. Referring to FIG. 5B, the first storage area 10 is used as the main storage area. At this time, the sector 14 including the third storage area 30 is also used as the main storage area. The fourth storage area 32 located in the second storage area 20 is used as OTP to store a variety of control information. Unlike FIG. 5A, the boot area does not exist in FIG. 5B. The part of the second storage area 20 other than the fourth storage area 32 is unused.

Figure 6:
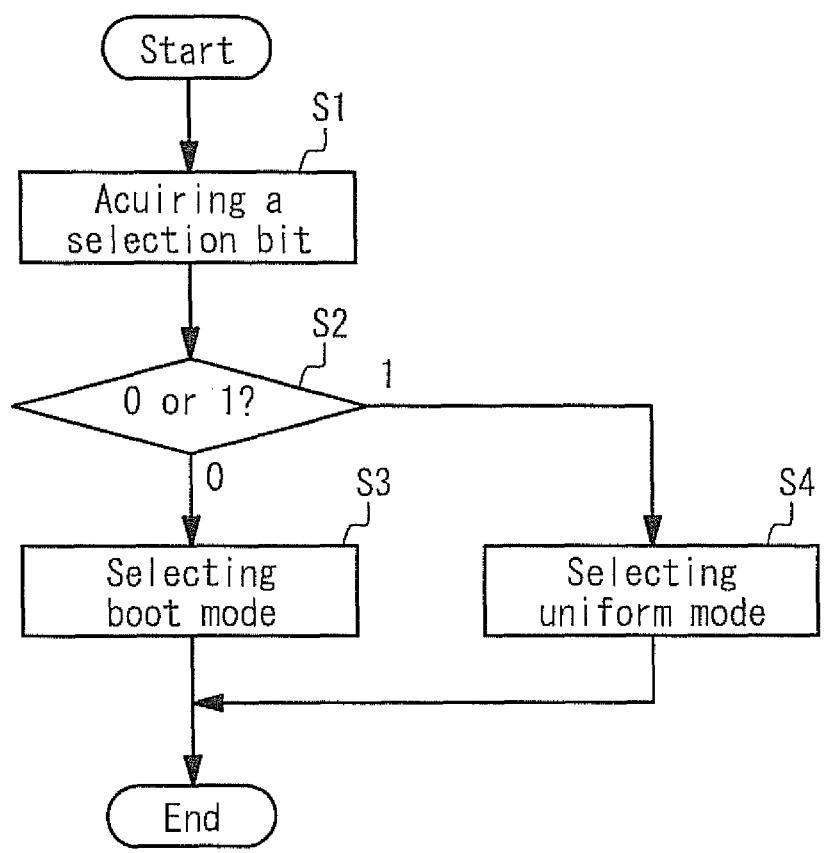
FIG. 6 is a flowchart of a sequence of the mode selecting operation executed by the control portion of the semiconductor device according to the embodiment of the present invention.

FIG. 6 is a flowchart of a sequence of the mode selecting operation executed by the control portion 52. Referring to FIG. 4A and FIG. 6, the control portion 52 acquires the selection bit from the bit storage area 53 (step S1). Next, the control portion 52 judges the acquired selection bit (step S2). If the selection bit is 0, the control portion 52 selects the boot mode (first mode), and a storage area 50a is configured as shown in FIG. 5A (Step S3). In contrast, if the selection bit is 1, the control portion 52 selects the uniform mode (second mode), and a storage area 50b is configured as shown in FIG. 5B (Step S4). As mentioned above, the control portion 52 selects the boot mode or the uniform mode, and the storage area 50 is configured according to the selected mode.

According to the present embodiment, the third storage area 30 is located in the first storage area 10, and the fourth storage area 32 is located in the second storage area 20. The control portion 52 selects the operating mode (first mode or the second mode). The third storage area 30 is used as OTP in the first mode and the fourth storage area 32 is used as OTP in the second mode. Since the unused area in the first storage area 10 or the second storage area 20 is used to store a variety of control information, the entire storage area of the semiconductor device can be reduced.

The above-mentioned semiconductor device has the same number of columns as that of each of the first storage area 10 and the second storage area 20, and the control portion 52 erases data simultaneously on the column basis. Unlike the first comparative example and the second comparative example, the second storage area 20 is not logically substituted for the first storage area 10. Thus, data may be erased and rewritten per column in the uniform mode, and the drive circuit generating large current is not needed. Moreover, the block selection circuit 40 (described in the second comparative example) is not needed. Therefore, the entire storage area can be reduced.

Moreover, the first storage area 10 used as the main storage area is larger than the second storage area 20 used as the boot area. Since data or a program that is read before the main storage area is accessed does not need a large storage capacity, the storage area of the semiconductor device can be efficiently used with the above-mentioned structure.

In the above-mentioned embodiment, the control portion 52 may be inhibited from re-selecting the boot mode or the uniform mode once the control portion 52 selects one operation mode. Therefore, the mode change by a user can be inhibited.

In the above-mentioned embodiment, although the control portion 52 electrically selects the operation mode by using the selection bit, the mode may be selected by another method.

For instance, there is a method of switching the circuit by metal etching. The mode may be selected after shipment instead of the mode selection by the manufacturer of the electric device at the time of shipment.

In the above-mentioned embodiment, although the third storage area 30 and the fourth storage area 32 are located in the same column, the third storage area 30 and the fourth storage area 32 may be located in different columns. Though the sector 14 and the block 22 are adjacent to each other in the above-mentioned embodiment, the sector 14 and the block 22 may not be adjacent. These configurations can be suitably changed according to the purpose of use. However, it is desirable from the viewpoint of the circuit design that the third storage area 30 and the fourth storage area 32 are located in the same column, preferably, in a short distance.

In the above-mentioned embodiment, although the third storage area 30 and the fourth storage area 32 are used as the one time programmable memory (OTP), the third storage area 30 and the fourth storage area 32 may be a nonvolatile memory capable of erasing and rewriting data.

Although a few preferred embodiments of the present invention have been shown and described, it would be appreciated by those skilled in the art that changes may be made in these embodiments without departing from the principles and spirit of the invention, the scope of which is defined in the claims and their equivalents.

We claim:

1. A semiconductor device comprising:
   a first nonvolatile storage area including a plurality of sectors;
   a second nonvolatile storage area;
   a third nonvolatile storage area located in the first nonvolatile storage area;
   a fourth nonvolatile storage area located in the second nonvolatile storage area; and
   a control portion that is configured to select between two modes that control storage in four storage areas selecting one of a first mode and a second mode wherein the first and the second modes determine whether control information is stored in the third or the fourth nonvolatile storage area wherein one of the first mode and the second mode is a boot mode and in the first mode the third storage area is used as one time programmable memory, wherein:
   in the first mode, sectors of the first nonvolatile storage area where the third nonvolatile storage area is not located are used as a main storage area, and the second nonvolatile storage area is used to store a program or data that is read before the first nonvolatile storage area is accessed, the third nonvolatile storage area being used to store control information that controls writing, reading, and erasing of data involved in the first nonvolatile storage area or the second nonvolatile storage area; and
   in the second mode, the first nonvolatile storage area is used as the main storage area, and the fourth nonvolatile storage area is used to store the control information.

2. The semiconductor device according to claim 1, wherein the first nonvolatile storage area is larger than the second nonvolatile storage area.

3. The semiconductor device according to claim 1, wherein a storage area of the second nonvolatile storage area other than another storage area in which the fourth nonvolatile storage area is provided is unused in the second mode.

4. The semiconductor device according to claim 1, wherein the first nonvolatile storage area and the second nonvolatile storage area have an identical number of columns, and the control portion erases data stored in the first nonvolatile storage area and data in the second nonvolatile storage area simultaneously for each column.

5. The semiconductor device according to claim 4, wherein the third nonvolatile storage area and the fourth nonvolatile storage area are located in an identical column.

6. The semiconductor device according to claim 1, wherein the third nonvolatile storage area and the fourth nonvolatile storage area are one time memories.

7. The semiconductor device according to claim 1, wherein the control portion inhibits one of the first mode and the second mode from being reselected once any one of the first mode and the second mode is selected.

8. A method for controlling a semiconductor device including a first nonvolatile storage area containing a plurality of sectors, a second nonvolatile storage area, a third nonvolatile storage area located in the first nonvolatile storage area, a fourth nonvolatile storage area located in the second nonvolatile storage area, comprising:
   from a controller that is configured to select between two modes that control storage in four storage areas, selecting one of a first mode and a second mode wherein the first and the second modes determine whether control information is stored in the third or the fourth nonvolatile storage area wherein one of the first mode and the second mode is a boot mode and in the first mode the third storage area is used as one time programmable memory, wherein:
   in the first mode, sectors of the first nonvolatile storage area where the third nonvolatile storage area is not located are used as a main storage area, and the second nonvolatile storage area is used to store a program or data that is read before the first nonvolatile storage area is accessed, the third nonvolatile storage area being used to store control information that controls writing, reading, and erasing of data involved in the first nonvolatile storage area or the second nonvolatile storage area; and
   in the second mode, the first nonvolatile storage area is used as the main storage area, and the fourth nonvolatile storage area is used to store the control information.

* * * * *